United States Patent
Lee et al.

[11] Patent Number: 5,892,386
[45] Date of Patent: Apr. 6, 1999

[54] INTERNAL POWER CONTROL CIRCUIT FOR A SEMICONDUCTOR DEVICE

[75] Inventors: Kyu-chan Lee, Seoul; Jung-hwa Lee; Seung-moon Yoo, both of Kyungki-do, all of Rep. of Korea

[73] Assignee: Samsung Electronics Co., Ltd., Suwon, Japan

[21] Appl. No.: 760,250

[22] Filed: Dec. 5, 1996

[30] Foreign Application Priority Data

Oct. 5, 1996 [KR] Rep. of Korea ................. 1996-44124

[51] Int. Cl.⁶ ............................................. H03K 3/037
[52] U.S. Cl. .......................... 327/530; 327/99; 327/199; 327/208
[58] Field of Search ................... 327/99, 185, 199, 327/207, 208, 214, 403, 404, 407, 408, 530, 545, 546

[56] References Cited

U.S. PATENT DOCUMENTS 3,502,905 3/1970 Bicking ....................... 307/235
4,617,473 10/1986 Bingham ....................... 307/66

Primary Examiner—Timothy P. Callahan
Assistant Examiner—Jeffrey Zweizig
Attorney, Agent, or Firm—William L. Geary, Jr.

[57] ABSTRACT

An internal power control circuit for a semiconductor device allows easy testing of the internal circuit blocks or memory arrays at various voltage levels. In the semiconductor device, internal voltage switching circuits connected between the internal power supply line and each array power supply line are switched ON or OFF according to signals applied to control pads coupled to each internal voltage switching circuit. During normal operation, a power voltage generated by the internal voltage generator is applied through an internal power supply line to each array power supply line coupled to the internal circuit blocks. During a test operation, different power voltages may be applied to the control pads to selectively decouple individual array power supply lines from the internal power supply line, and selectively couple the power voltages applied to the control pads to the corresponding array power supply lines and internal circuit blocks.

26 Claims, 3 Drawing Sheets

INTERNAL POWER CONTROL CIRCUIT FOR A SEMICONDUCTOR DEVICE

BACKGROUND OF THE INVENTION

The present invention relates to an internal power control circuit for a semiconductor device and a method of controlling the supply of internal power, and more particularly, to an internal power control circuit having an improved capability for use in analyzing defects such as leakage current failure in semiconductor devices.

As semiconductor devices such as dynamic random access memory become more highly integrated, it is important to test whether the semiconductor device operates properly after the fabrication process and to find the causes of improper operation. In order to produce a perfectly operational product, various types of analyses must be performed on a product sample in the initial stages of development, and the analyses are very time-consuming. For these analyses, it is necessary that tests of operational characteristics and the detection of circuit malfunctions be performed at various levels of power voltage supplied to the semiconductor circuitry.

FIG. 1 shows a conventional internal power control circuit for a semiconductor device and its related circuitry. Referring to FIG. 1, in a normal operation mode, an internal power voltage generated by an internal voltage generator 130 in a semiconductor device 110 is supplied to memory cell arrays 120A, 120B, 120C, and 120D via an internal power supply line 150. When the operational characteristics of the semiconductor device are analyzed, each memory cell array 120A, 120B, 120C, and 120D is tested while the power generated from the internal voltage generator 130 is supplied thereto. In addition, the semiconductor device is tested while an external power voltage is applied thereto via a pad 140, while the internal voltage generator 130 is disabled or isolated from the internal power supply line 150.

As shown in FIG. 1, the internal power supply line 150 is commonly connected to each memory cell array 120A, 120B, 120C, and 120D. Thus, when either the voltage level or current level in the semiconductor device is abnormal, that is, when a defect is found during the testing process, it is difficult to determine which component is causing the defect. Particularly, when defects such as power bridges and current leakage are found, which often occur in the initial stages of development of a semiconductor device, it is difficult to find the exact source of the problem. Thus, much time is required to develop and test the semiconductor device.

SUMMARY OF THE INVENTION

It is an object of the present invention to provide an internal power control circuit for a semiconductor device which allows easy analysis and testing of different portions of the device circuitry.

It is another object of the present invention to provide an internal power control circuit which results in a quicker development and testing period for a semiconductor device.

It is a further object of the invention to allow different power supply voltages to be externally supplied and routed to different portions of a semiconductor device.

To achieve the above objects, there is provided an internal power control circuit for a semiconductor device having a plurality of internal circuit blocks, comprising:

an internal voltage generator for converting an externally applied power voltage to a voltage which is adequate for driving said internal circuit blocks;

a plurality of array power supply lines each connected to said corresponding internal circuit block;

an internal power supply line connected to said internal voltage generator;

a plurality of control pads corresponding to said internal circuit blocks;

a plurality of internal voltage switching circuits each connected between said corresponding array power supply line and said corresponding internal power supply line, and capable of being switched ON or OFF according to a signal applied to the corresponding control pad;

a plurality of power supply switching circuits each connected between said corresponding array power supply line and said corresponding control pad, for supplying a signal applied to said corresponding control pad through said array power supply lines according to the signal applied to said corresponding control pad;

a plurality of array power connection logic circuits for generating an array power connection signal upon receiving signals from two of said control pads; and a plurality of array power connection circuits each connected between said corresponding array power supply lines and capable of being switched ON or OFF according to the outputs of said array power connection logic circuits, wherein a power voltage generated from said internal voltage generator is applied to said internal circuit blocks through said corresponding array power supply lines when said internal voltage switching circuits are ON during a normal operation, and a power voltage applied to the corresponding control pad is applied to said internal circuit blocks through said corresponding array power supply lines when said internal voltage switching circuits are OFF for a test operation.

When the semiconductor device is a semiconductor memory device, some or all of the internal circuit blocks correspond to memory cell arrays.

In one embodiment of the invention, the internal voltage switching circuits each are composed of a PMOS transistor having a source connected to the internal power supply line, a drain connected to the corresponding array power supply line and a gate connected to the corresponding control pad. The power supply switching circuits each include an inverter for inverting the signal from the control pads, a PMOS transistor having a source connected to the corresponding control pad, a drain connected to the corresponding array power supply line and a gate to which the output of the inverter is applied, and an NMOS transistor having a drain connected to the corresponding control pad, a grounded source, and a gate to which the output of the inverter is applied. The logic gates each include a NAND gate for receiving the signal of the corresponding control pads, and the array power supply line connecting devices each are composed of a PMOS transistor having a source and a drain which are connected to the corresponding array power supply lines and a gate to which the output of the corresponding NAND gate is applied.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
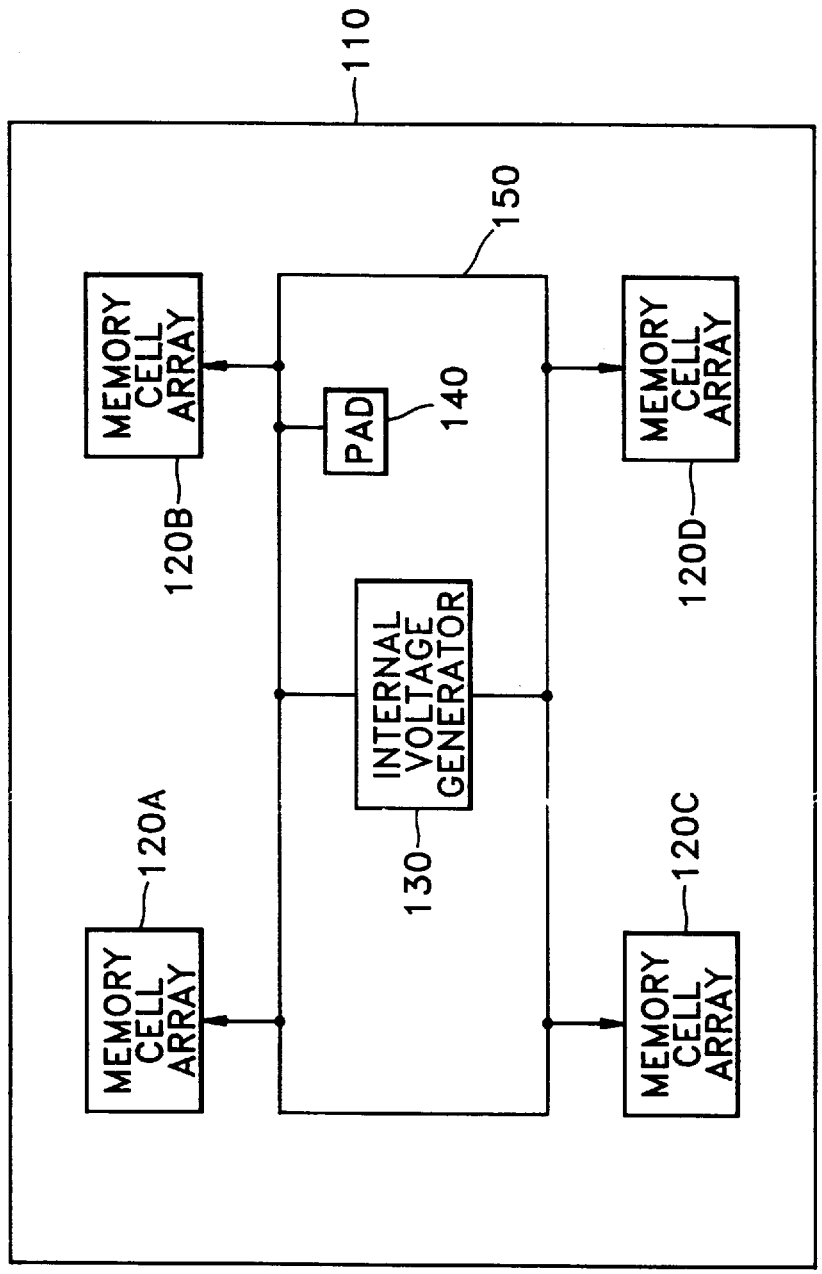
FIG. 1 is a block diagram showing a conventional internal power control circuit of a semiconductor device.
Figure 2:
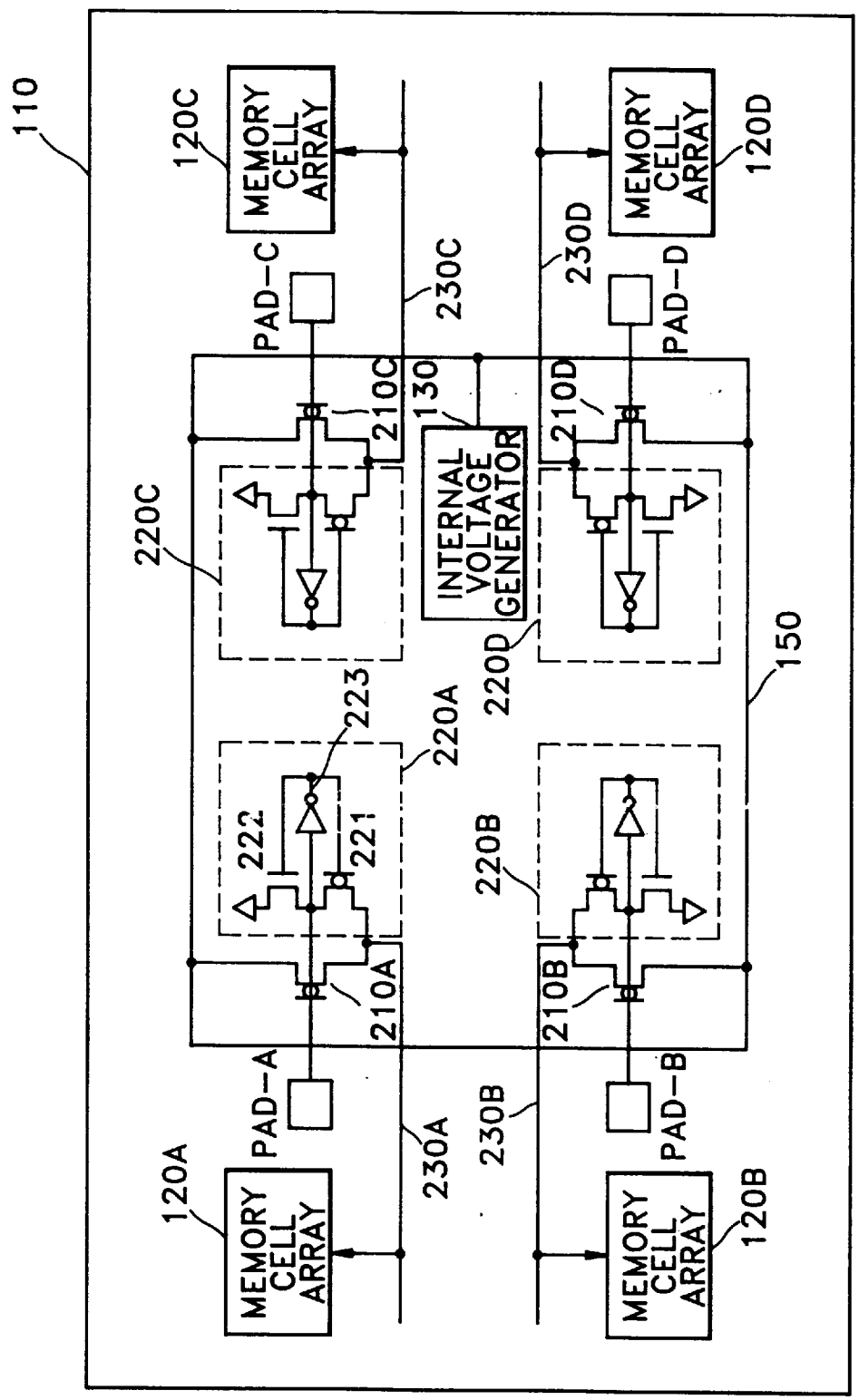
FIG. 2 is a circuit diagram showing an internal power control circuit for a semiconductor device according to an embodiment of the present invention.

Referring to FIG. 2, array power supply lines 230A, 230B, 230C, and 230D are connected to a plurality of memory cell arrays 120A, 120B, 120C, and 120D, respectively. Also, internal voltage switching circuits 210A, 210B, 210C, and 210D, and power supply switching circuits 220A, 220B, 220C, and 220D correspond to the memory cell arrays 120A, 120B, 120C, and 120D, respectively. Each internal voltage switching circuit 210A, 210B, 210C, and 210D is composed of a PMOS transistor, although NMOS transistors or other switching circuitry may be substituted. The source of each PMOS transistor constituting the internal voltage switching circuits 210X (where X is A, B, C, or D) is connected to an internal power supply line 150, the drain is connected to the corresponding array power supply line, and the gate is connected to the corresponding control pad PAD-X (where X is A, B, C, or D). Control pads PAD-A, PAD-B, PAD-C, and PAD-D operate as control and input ports to which an external power source can directly be supplied for testing the semiconductor device. Each power supply switching circuit 220A, 220B, 220C, and 220D is composed of a PMOS transistor 221, an NMOS transistor 222, and an inverter 223, although other suitable switching circuitry may easily be substituted.

The circuitry operates as follows when a "low" signal is supplied to control pad PAD-A. In FIG. 2, in the NMOS transistor 222 of the power supply switching circuit 220A, the drain is connected to the control pad PAD-A, the source is grounded, and the gate receives the output of inverter 223. Thus, when a "low" signal is applied to the control pad PAD-A, the output of the inverter 223 is "high". Accordingly, the NMOS transistor 222 turns ON and the control pad PAD-A is maintained at a "low" level. The low level on PAD-A turns ON the internal voltage switching circuit 210A, thereby connecting the array power supply line 230A to the internal power supply line 150. This is the normal state of the circuitry in a non-test mode, in which "low" signals are supplied to each of the control pads, thereby connecting the internal power source to each of the array power supply lines 230A–D.

The circuitry operates as follows when a "high" signal is applied to control pad PAD-A. In FIG. 2, in the power supply switching circuit 220A, the inverter 223 inverts the signal from the control pad PAD-A. In the PMOS transistor 221, the source is connected to the corresponding control pad PAD-A, the drain is connected to the corresponding array power line 230A, and the gate receives the output of inverter 223. Thus, when a "high" signal is applied to the control pad PAD-A, the output of the inverter 223 is "low," thereby turning ON the PMOS transistor 221 and connecting the array power supply line 230A to the control pad PAD-A. The "high" signal on PAD-A also turns OFF transistor 210A and disconnects the array power supply line 230A from the internal power supply line 150. Accordingly, a "high" signal applied to the control pad PAD-A is routed through the array power supply line 230A to the memory cell array 120A as an externally supplied power source.

During normal operation, when "low" signals are applied to all control pads, an internal voltage generator 130 connected to internal power supply line 150 converts an external power voltage (not shown) to a voltage level which is supplied via array power supply lines 230A, 230B, 230C, and 230D to the memory cell arrays 120A, 120B, 120C, and 120D (or circuit blocks in a non-memory device). However, during a test operation, the internal power supply line 150 may be selectively disconnected from the individual circuit blocks by applying "high" signals to selected control pads. The individual control pads PAD-X (where X is A, B, C, or D) may be supplied with different voltage signals for different types of test operations, or for different types of operating conditions, and the different voltage signals will be routed to the circuit blocks corresponding to the selected control pads.

It is apparent from the above description that the internal voltage switching circuits 210A, 210B, 210C, and 210D are responsive to first and second signals applied to the control pads PAD-A, PAD-B, PAD-C, and PAD-D, which are coupled to the respective internal voltage switching circuits. If switching circuit 210A comprises a PMOS transistor, then it is switched ON by first signal applied to control pad PAD-A which is a "low" at the gate of the PMOS transistor, and it is switched OFF by a second signal applied to control pad PAD-A which is a "high" at the gate of the PMOS transistor. If switching circuit 210A comprises an NMOS transistor, then it is switched ON by first signal applied to control pad PAD-A which is a "high" at the gate of the NMOS transistor, and it is switched OFF by a second signal applied to control pad PAD-A which is a "low" at the gate of the NMOS transistor.

Figure 3:
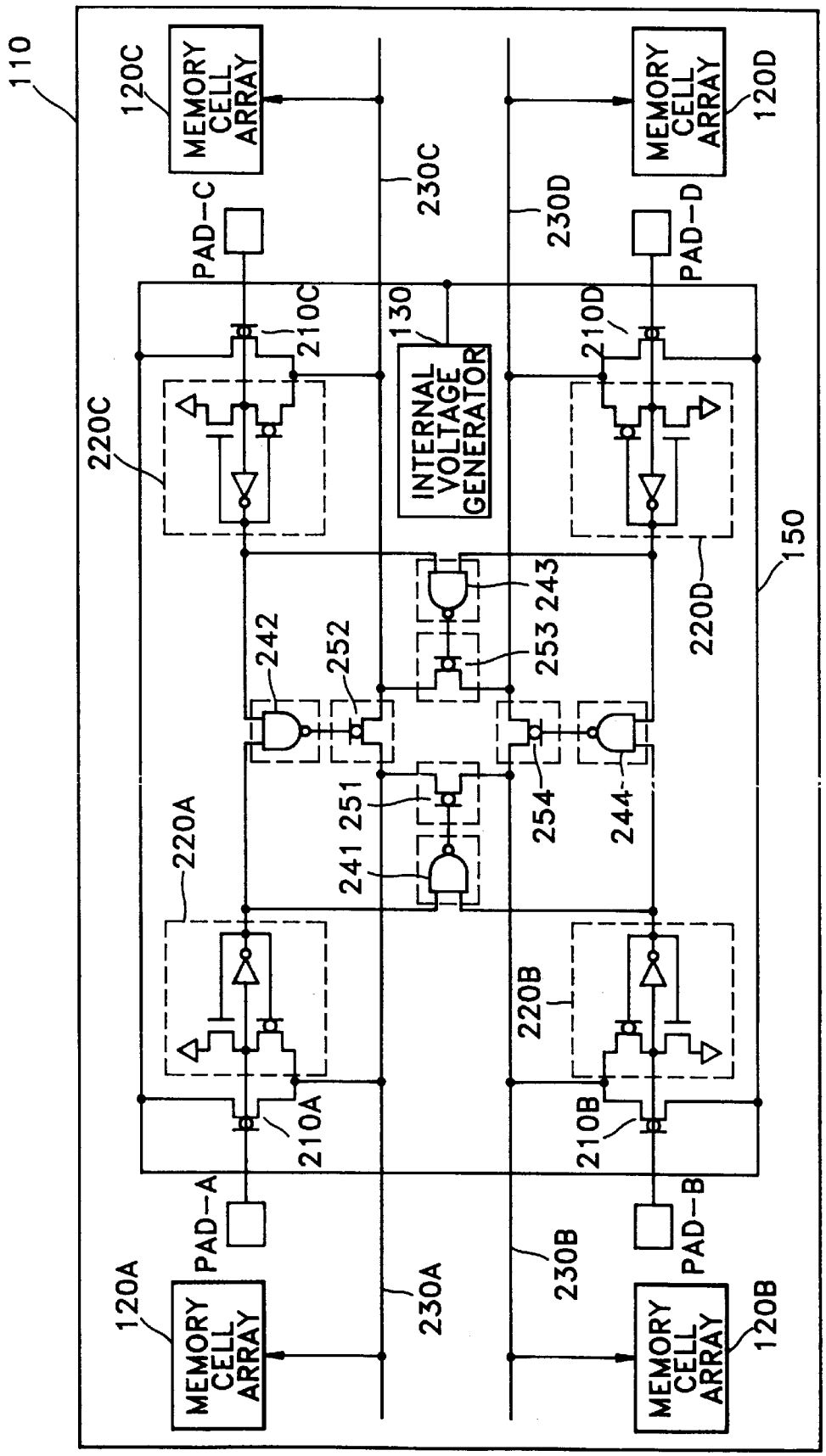
FIG. 3 is a circuit diagram showing an internal power control circuit for a semiconductor device according to another embodiment of the present invention.

FIG. 3 shows an internal power control circuit for a semiconductor device according to another embodiment of the present invention. In this embodiment, the power control circuitry selectively connects together the array power supply lines 230A, 230B, 230C, and 230D that are selected via the control pads to receive the internal supply voltage, thereby insuring the same voltage level on each of these selected lines. In FIG. 3, the internal power control circuit of the semiconductor device includes control pads PAD-A, PAD-B, PAD-C, and PAD-D; internal voltage switching circuits 210A, 210B, 210C, and 210D; power supply switching circuits 220A, 220B, 220C, and 220D; array power supply lines 230A, 230B, 230C, and 230D; internal voltage generator 130; internal power supply line 150; array power connection logic circuits 241, 242, 243, and 244; and array power connection circuits 251, 252, 253, and 254. Each array power connection logic circuit 241, 242, 243, and 244 is composed of NAND gates, and the inverted signals from two of the control pads PAD-A, PAD-B, PAD-C, and PAD-D are applied to the inputs of each NAND gate. Each NAND gate generates an array power connection signal upon receiving signals from two of the control pads PAD-A, PAD-B, PAD-C, and PAD-D. The array power connection signal, which is the output of NAND gate, is "low" when the signals applied to the corresponding control pads are "low." The array power connection signal is applied to the gate of the corresponding array power connection circuit, which is activated by a "low" signal. The source and drain of each array power connection circuit 251, 252, 253, and 254 are connected to the corresponding array power supply lines 230A, 230B, 230C, and 230D. Thus, when the signals applied to the corresponding control pads are simultaneously "low", the array power connection circuit turns ON and the corresponding array power supply lines are electrically connected to each other.

The same or similar switching operations may be performed by equivalent logic circuitry. For example, the identical switching operation performed by NAND gate 242 and PMOS transistor 252 could be performed by an AND gate in combination with an NMOS transistor. Equivalent circuit combinations for performing the same operations are well-known to one of ordinary skill in the art and are within the scope of this invention. Other embodiments may be realized by other combinations of array power connection logic circuits and array power connection circuits. For example, the addition of two more sets of such circuits would allow the connection of array power supply lines 230A to 230D, and 230B to 230C.

In FIGS. 2 and 3, the internal power control circuit of a semiconductor memory device was described. However, the internal power control circuits shown in FIGS. 2 and 3 may also be applied to any semiconductor device having a plurality of internal circuit blocks. If the internal power control circuit is applied to a semiconductor device having a plurality of internal circuit blocks, then the plurality of memory cell arrays shown in FIG. 2 and 3 should be replaced by a plurality of internal circuit blocks, wherein the array power supply lines supply the internal power to each circuit block. More than one circuit block may be connected to an array power supply line, and a control pad may be connected to more than one internal voltage switching circuit and associated power supply switching circuit.

Consequently, according to the present invention, an internal power control circuit for a semiconductor device reduces the time required for isolating defects and for testing and analyzing the operational characteristics of a semiconductor device, particularly during the initial product development stages. Furthermore, when analyzing the characteristics of a highly integrated device such as a semiconductor memory device, the characteristics of each individual memory cell array unit may be analyzed separately or under varying conditions, resulting in a very accurate analysis.

The present invention is not limited to the particular embodiments illustrated herein, and further modifications and alterations will be evident to those skilled in the art. Such modifications are encompassed within the spirit and scope of this invention, as set forth in the appended claims.

What is claimed is:

1. An internal power control circuit for a semiconductor device having a plurality of memory cell arrays, comprising:
   an internal voltage generator having an output connected to an internal power supply line, said internal voltage generator supplying an internal voltage on said output for powering said memory cell arrays;
   a plurality of array power supply lines connected to said memory cell arrays;
   one or more internal voltage switching circuits, each said internal voltage switching circuit having a control input, and a pair of switching terminals connected between said internal power supply line and a corresponding said array power supply line; and
   one or more control pads each coupled to said control input of a said internal voltage switching circuit, wherein each said internal voltage switching circuit is controllable according to a first or a second signal applied to the coupled control pad, either ON in response to said first signal to couple said corresponding array power supply line to said internal power supply line, or OFF in response to said second signal to decouple said corresponding array power supply line from said internal power supply line.

2. An internal power control circuit for a semiconductor device as in claim 1, wherein each said internal voltage switching circuit comprises a transistor having a gate, a source, and a drain, wherein said gate is said control input, and said source and drain are said pair of switching terminals.

3. An internal power control circuit for a semiconductor device as in claim 2, wherein each said internal voltage switching circuit comprises a PMOS transistor having a source connected to said internal power supply line, a drain connected to said corresponding array power supply line, and a gate connected to said corresponding control pad, and wherein said first signal is a ground voltage and said second signal is a positive voltage.

4. An internal power control circuit for a semiconductor device as in claim 3, wherein each said control pad is coupled to said control input of one or more said internal voltage switching circuits, whereby one said control pad controls one or more said internal voltage switching circuits.

5. An internal power control circuit for a semiconductor device having a plurality of memory cell arrays, comprising:
   an internal voltage generator having an output connected to an internal power supply line, said internal voltage generator supplying an internal voltage on said output for powering said memory cell arrays;
   a plurality of array power supply lines connected to said memory cell arrays;
   one or more internal voltage switching circuits, each said internal voltage switching circuit having a control input, and a pair of switching terminals connected between said internal power supply line and a corresponding said array power supply line;
   one or more power supply switching circuits each associated with a said internal voltage switching circuit, each said associated power supply switching circuit having a power input, and an output coupled to said corresponding array power supply line;
   one or more control pads each coupled to said control input of a said internal voltage switching circuit and said power input of said associated power supply switching circuit;
   wherein a first signal applied to said coupled control pad controls said internal voltage switching circuit ON to couple said corresponding array power supply line to said internal power supply line, and controls said associated power supply switching circuit OFF to decouple said power input from said corresponding array power supply line; and
   wherein a second signal applied to said coupled control pad controls said internal voltage switching circuit OFF to decouple said corresponding array power supply line from said internal power supply line, and controls said associated power supply switching circuit ON to couple said power input to said corresponding array power supply line.

6. An internal power control circuit for a semiconductor device as in claim 5, wherein each said internal voltage switching circuit comprises a PMOS transistor having a source connected to said internal power supply line, a drain connected to said corresponding array power supply line, and a gate connected to said coupled control pad, and wherein said first signal is a ground voltage and said second signal is a positive voltage.

7. An internal power control circuit for a semiconductor device as in claim 6, wherein each said corresponding power supply switching circuit comprises:
   an inverter having an input coupled to said coupled control pad, and an output;

a PMOS transistor having a source connected to said input of said inverter, a gate connected said output of said inverter, and a drain connected to said corresponding array power supply line; and an NMOS transistor having a drain connected to said input of said inverter, a gate connected to said output of said inverter, and a source coupled to a ground voltage.

8. An internal power control circuit for a semiconductor device as in claim 7, wherein each said control pad is coupled to said control input of one or more said internal voltage switching circuits, and to said power input of one or more said associated power supply switching circuits, whereby one said control pad controls one or more said internal voltage switching circuits and one or more said associated power supply switching circuits.

9. An internal power control circuit for a semiconductor device having a plurality of memory cell arrays, comprising:

an internal voltage generator having an output connected to an internal power supply line, said internal voltage generator supplying an internal voltage on said output for powering said memory cell arrays;

a plurality of array power supply lines connected to said memory cell arrays;

one or more internal voltage switching circuits, each said internal voltage switching circuit having a control input, and a pair of switching terminals connected between said internal power supply line and a corresponding said array power supply line;

one or more power supply switching circuits each associated with a said internal voltage switching circuit, each said associated power supply switching circuit having a power input, and an output coupled to said corresponding array power supply line;

one or more control pads each coupled to said control input of a said internal voltage switching circuit and said power input of said associated power supply switching circuit;

one or more array power connection logic circuits each having two inputs responsive to signals applied to two said control pads, and an output, wherein each said array power connection logic circuit generates an array power connection signal on said output in response to said signals;

one or more array power connection circuits each associated with a said array power connection logic circuit and having an input coupled to said output of said associated array power connection logic circuit, and a pair of outputs connected between two said array power supply lines associated with said two control pads, whereby said array power connection signal controls said associated array power connection circuit ON in response to said signals applied to said two control pads to couple together said two associated array power supply lines;

wherein a first signal applied to said coupled control pad controls said internal voltage switching circuit ON to couple said corresponding array power supply line to said internal power supply line, and controls said associated power supply switching circuit OFF to decouple said power input from said corresponding array power supply line; and wherein a second signal applied to said coupled control pad controls said internal voltage switching circuit OFF to decouple said corresponding array power supply line from said internal power supply line, and controls said associated power supply switching circuit ON to couple said power input to said corresponding array power supply line.

10. An internal power control circuit for a semiconductor device as in claim 9, wherein each said internal voltage switching circuit comprises a PMOS transistor having a source connected to said internal power supply line, a drain connected to said corresponding array power supply line, and a gate connected to said coupled control pad, and wherein said first signal is a ground voltage and said second signal is a positive voltage.

11. An internal power control circuit for a semiconductor device as in claim 10, wherein each said associated power supply switching circuit comprises:

an inverter having an input coupled to said coupled control pad, and an output;

a PMOS transistor having a source connected to said input of said inverter, a gate connected said output of said inverter, and a drain connected to said corresponding array power supply line; and an NMOS transistor having a drain connected to said input of said inverter, a gate connected to said output of said inverter, and a source coupled to a ground voltage.

12. An internal power control circuit for a semiconductor device as in claim 11, wherein:

each said array power connection logic circuit comprises a NAND gate having two inputs responsive to said signals on said two control pads and one output for producing an array power connection signal; and each said associated array power connection circuit comprises a PMOS transistor having a gate coupled to said output of said NAND gate, and a source and a drain corresponding to said pair of outputs.

13. An internal power control circuit for a semiconductor device as in claim 11, wherein:

each said array power connection logic circuit comprises an AND gate having two inputs responsive to said signals on said two control pads and one output for producing an array power connection signal; and each said associated array power connection circuit comprises an NMOS transistor having a gate coupled to said output of said AND gate, and a source and a drain corresponding to said pair of outputs.

14. An internal power control circuit for a semiconductor device having a plurality of circuit blocks, comprising:

an internal voltage generator having an output connected to an internal power supply line, said internal voltage generator supplying an internal voltage on said output for powering said circuit blocks;

a plurality of array power supply lines connected to said circuit blocks;

one or more internal voltage switching circuits, each said internal voltage switching circuit having a control input, and a pair of switching terminals connected between said internal power supply line and a corresponding said array power supply line; and one or more control pads each coupled to said control input of a said internal voltage switching circuit, wherein each said internal voltage switching circuit is controllable according to a first or a second signal applied to the coupled control pad, either ON in response to said first signal to couple said corresponding array power supply line to said internal power supply line, or OFF in response to said second signal to decouple said corresponding array power supply line from said internal power supply line.

15. An internal power control circuit for a semiconductor device as in claim 14, wherein each said internal voltage switching circuit comprises a transistor having a gate, a source, and a drain, wherein said gate is said control input, and said source and drain are said pair of switching terminals.

16. An internal power control circuit for a semiconductor device as in claim 15, wherein each said internal voltage switching circuit comprises a PMOS transistor having a source connected to said internal power supply line, a drain connected to said corresponding array power supply line, and a gate connected to said corresponding control pad, and wherein said first signal is a ground voltage and said second signal is a positive voltage.

17. An internal power control circuit for a semiconductor device as in claim 16, wherein each said control pad is coupled to said control input of one or more said internal voltage switching circuits, whereby one said control pad controls one or more said internal voltage switching circuits.

18. An internal power control circuit for a semiconductor device having a plurality of circuit blocks, comprising:
   an internal voltage generator having an output connected to an internal power supply line, said internal voltage generator supplying an internal voltage on said output for powering said circuit blocks;
   a plurality of array power supply lines connected to said circuit blocks;
   one or more internal voltage switching circuits, each said internal voltage switching circuit having a control input, and a pair of switching terminals connected between said internal power supply line and a corresponding said array power supply line;
   one or more power supply switching circuits each associated with a said internal voltage switching circuit, each said associated power supply switching circuit having a power input, and an output coupled to said corresponding array power supply line;
   one or more control pads each coupled to said control input of a said internal voltage switching circuit and said power input of said associated power supply switching circuit;
   wherein a first signal applied to said coupled control pad controls said internal voltage switching circuit ON to couple said corresponding array power supply line to said internal power supply line, and controls said associated power supply switching circuit OFF to decouple said power input from said corresponding array power supply line; and
   wherein a second signal applied to said coupled control pad controls said internal voltage switching circuit OFF to decouple said corresponding array power supply line from said internal power supply line, and controls said associated power supply switching circuit ON to couple said power input to said corresponding array power supply line.

19. An internal power control circuit for a semiconductor device as in claim 18, wherein each said internal voltage switching circuit comprises a PMOS transistor having a source connected to said internal power supply line, a drain connected to said corresponding array power supply line, and a gate connected to said coupled control pad, and wherein said first signal is a ground voltage and said second signal is a positive voltage.

20. An internal power control circuit for a semiconductor device as in claim 19, wherein each said corresponding power supply switching circuit comprises:
   an inverter having an input coupled to said coupled control pad, and an output;
   a PMOS transistor having a source connected to said input of said inverter, a gate connected said output of said inverter, and a drain connected to said corresponding array power supply line; and
   an NMOS transistor having a drain connected to said input of said inverter, a gate connected to said output of said inverter, and a source coupled to a ground voltage.

21. An internal power control circuit for a semiconductor device as in claim 20, wherein each said control pad is coupled to said control input of one or more said internal voltage switching circuits, and to said power input of one or more said associated power supply switching circuits, whereby one said control pad controls one or more said internal voltage switching circuits and one or more said associated power supply switching circuits.

22. An internal power control circuit for a semiconductor device having a plurality of circuit blocks, comprising:
   an internal voltage generator having an output connected to an internal power supply line, said internal voltage generator supplying an internal voltage on said output for powering said circuit blocks;
   a plurality of array power supply lines connected to said circuit blocks;
   one or more internal voltage switching circuits, each said internal voltage switching circuit having a control input, and a pair of switching terminals connected between said internal power supply line and a corresponding said array power supply line;
   one or more power supply switching circuits each associated with a said internal voltage switching circuit, each said associated power supply switching circuit having a power input, and an output coupled to said corresponding array power supply line;
   one or more control pads each coupled to said control input of a said internal voltage switching circuit and said power input of said associated power supply switching circuit;
   one or more array power connection logic circuits each having two inputs responsive to signals applied to two said control pads, and an output, wherein each said array power connection logic circuit generates an array power connection signal on said output in response to said signals;
   one or more array power connection circuits each associated with a said array power connection logic circuit and having an input coupled to said output of said associated array power connection logic circuit, and a pair of outputs connected between two said array power supply lines associated with said two control pads, whereby said array power connection signal controls said associated array power connection circuit ON in response to said signals applied to said two control pads to couple together said two associated array power supply lines;
   wherein a first signal applied to said coupled control pad controls said internal voltage switching circuit ON to couple said corresponding array power supply line to said internal power supply line, and controls said associated power supply switching circuit OFF to decouple said power input from said corresponding array power supply line; and
   wherein a second signal applied to said coupled control pad controls said internal voltage switching circuit OFF to decouple said corresponding array power supply line from said internal power supply line, and controls said associated power supply switching circuit ON to couple said power input to said corresponding array power supply line.

23. An internal power control circuit for a semiconductor device as in claim 22, wherein each said internal voltage switching circuit comprises a PMOS transistor having a source connected to said internal power supply line, a drain connected to said corresponding array power supply line, and a gate connected to said coupled control pad, and wherein said first signal is a ground voltage and said second signal is a positive voltage.

24. An internal power control circuit for a semiconductor device as in claim 23, wherein each said associated power supply switching circuit comprises:

an inverter having an input coupled to said coupled control pad, and an output;

a PMOS transistor having a source connected to said input of said inverter, a gate connected said output of said inverter, and a drain connected to said corresponding array power supply line; and an NMOS transistor having a drain connected to said input of said inverter, a gate connected to said output of said inverter, and a source coupled to a ground voltage.

25. An internal power control circuit for a semiconductor device as in claim 24, wherein:

each said array power connection logic circuit comprises a NAND gate having two inputs responsive to said signals on said two control pads and one output for producing an array power connection signal; and each said associated array power connection circuit comprises a PMOS transistor having a gate coupled to said output of said NAND gate, and a source and a drain corresponding to said pair of outputs.

26. An internal power control circuit for a semiconductor device as in claim 24, wherein:

each said array power connection logic circuit comprises an AND gate having two inputs responsive to said signals on said two control pads and one output for producing an array power connection signal; and each said associated array power connection circuit comprises an NMOS transistor having a gate coupled to said output of said AND gate, and a source and a drain corresponding to said pair of outputs.

* * * * *